United States Patent
Chen et al.

(10) Patent No.: US 10,292,301 B1
(45) Date of Patent: May 14, 2019

(54) COUPLING ASSEMBLY AND CABLE MANAGEMENT DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/964,005

(22) Filed: Apr. 26, 2018

(30) Foreign Application Priority Data

Nov. 13, 2017 (TW) .............................. 106139379 A

(51) Int. Cl.
*H05K 7/18* (2006.01)
*H05K 7/14* (2006.01)
*H01R 9/24* (2006.01)

(52) U.S. Cl.
CPC ........... *H05K 7/183* (2013.01); *H01R 9/2416* (2013.01); *H05K 7/1489* (2013.01); *H05K 7/1491* (2013.01)

(58) Field of Classification Search
CPC .... H05K 7/183; H05K 7/1489; H05K 7/1491; H01R 9/2416

USPC ......................................................... 361/727
See application file for complete search history.

(56) References Cited

U.S. PATENT DOCUMENTS

| | | | |
|---|---|---|---|
| 6,902,069 B2 | 6/2005 | Hartman | |
| 6,972,949 B1 * | 12/2005 | Helgenberg | G06F 1/183 361/679.02 |
| 7,189,924 B1 * | 3/2007 | Popescu | H05K 7/1491 174/69 |
| 7,472,795 B2 * | 1/2009 | Dubon | H02G 3/128 211/26 |
| 7,473,846 B2 | 1/2009 | Doerr | |
| 7,554,819 B2 | 6/2009 | Chen | |
| 8,045,343 B2 * | 10/2011 | Fan | H05K 7/1491 361/810 |
| 8,379,410 B2 | 2/2013 | Kitten | |
| 8,833,715 B2 | 9/2014 | Chen | |
| 9,072,190 B2 * | 6/2015 | Chen | H05K 7/1491 |
| 9,144,174 B2 | 9/2015 | Chen | |
| 9,769,947 B1 * | 9/2017 | Sands | H05K 7/1491 |

(Continued)

*Primary Examiner* — Rockshana D Chowdhury
(74) *Attorney, Agent, or Firm* — Winston Hsu

(57) ABSTRACT

A coupling assembly includes a slide rail assembly and a cable management device. The slide rail assembly includes a first rail and a second rail. The first rail is displaceable relative to the second rail. The cable management device includes a first cable management arm, a second cable management arm, a member and a connecting member. The second cable management arm pivots with respect to the first cable management arm. The member pivots with respect to the first cable management arm. The connecting member is displaceable relative to the member. The second cable management arm is configured to connect to the second rail. The first cable management arm is connected to the first rail using the connecting member.

4 Claims, 8 Drawing Sheets

(56) References Cited

U.S. PATENT DOCUMENTS

| | | | |
|---|---|---|---|
| 9,949,400 B2* | 4/2018 | Yi | H05K 7/1491 |
| 2011/0100933 A1* | 5/2011 | Kitten | F16L 3/015 211/1 |

* cited by examiner

COUPLING ASSEMBLY AND CABLE MANAGEMENT DEVICE THEREOF

BACKGROUND OF THE INVENTION

1. Field of the Invention

The present invention relates to a cable management device, and more particularly, to a cable management device adapted to slide rails.

2. Description of the Prior Art

Typically, an electronic apparatus configured in a rack system is mounted onto a rack by using a slide rail assembly, such that the electronic apparatus can, through the use of slide rails of the slide rail assembly, be pulled from inside the rack to outside the rack, or be pushed into the rack from outside the rack. Since the electronic apparatus is equipped with cables, the cables need to be supported by using a cable management arm assembly.

As taught in U.S. Pat. No. 7,554,819 B2, a cable management arm assembly is designed to be mounted on a rear end of the slide rail assembly, so that the cable management arm assembly can be expanded with the slide rail. As shown in FIG. 1 of said patent, a frame 1 includes a front arm 11, a rear arm 12, and a support rail 2. The front arm 11 and the rear arm 12 are connected by using a pivot 13, and the front arm 11 and the rear arm 12 are connected to an inner rail C and an outer rail A of the slide rail assembly through an insertion socket 7 and a connector 5, respectively. The support rail 2 is configured to support the front arm 11 and the rear arm 12. Furthermore, U.S. Pat. No. 8,833,715 B2 discloses a connection device adapted between the cable management arm assembly and the slide assembly. The technology of the connection device 14 configured between the cable management arm 10 and the slide assembly 12 is disclosed in said patent. The aforesaid two patents are incorporated herein for reference.

However, in the art, the connection length between the cable management arm assembly or the frame and an object (e.g., a slide rail) is typically not adjustable (that is, the connection length is fixed), suggesting that the usable space is limited, leading to unfavorable conditions when mounting a set of cables on the cable management arm or causing inconvenience when maintaining related equipment.

SUMMARY OF THE INVENTION

The present invention provides a cable management device with a coupling assembly with adjustable length thereof.

According to an aspect of the present invention, a coupling assembly includes a slide rail assembly and a cable management device. The slide rail assembly includes a first rail and a second rail. The first rail is displaceable relative to the second rail. The cable management device includes a first cable management arm, a second cable management arm, a first member, and a first connecting member. The second cable management arm is pivoted with respect to the first cable management arm, and the first member is pivoted with respect to the first cable management arm. The first connecting member is connected to the first member in an extendable and retractable manner. The second cable management arm is connected to the second rail. The first cable management rail is connected to the first rail through the first connecting member.

Preferably, the cable management device further includes a first extension member. The first extension member is pivoted between the first cable management arm and the first member.

Preferably, the cable management device further includes a second member, a second connecting member, and a second extension member. The second member is pivoted with respect to the second cable management arm, and the second connecting member is connected to the second member in an extendable and retractable manner. The second extension member is pivoted between the second cable management arm and the second member, and the second cable management arm is connected to the second rail through the second connecting member.

Preferably, the cable management device further includes a supporting member, a mounting base and a third connecting member. The supporting member is configured to support one of the first cable management arm and the second cable management arm. The mounting base is arranged on the supporting member, and the third connecting member is connected to the mounting base in an extendable and retractable manner.

Preferably, the coupling assembly further includes another slide rail assembly. The aforementioned another slide rail assembly includes a third rail and a fourth rail. The third rail is displaceable relative to the fourth rail, and the third connecting member is connected to the fourth rail.

According to another aspect of the present invention, a cable management device includes a first cable management arm, a second cable management arm, a first member, and a first connecting member. The second cable management arm is movable relative to the first cable management arm, the first member is pivoted with respect to the first cable management arm, and the first connecting member is connected to the first member in an extendable and retractable manner.

Preferably, one of the first cable management arm and the second cable management arm has a cable holding feature.

According to another aspect of the present invention, a cable management device includes a first cable management arm, a second cable management arm, a first member, and a first mounting member. The second cable management arm is movable relative to the first cable management arm, the first member is pivoted with respect to the first cable management arm, and the first mounting member is detachable from the first member.

Preferably, a first connecting portion and a second connecting portion are disposed on two opposite ends of the first mounting member. The first connecting portion has a latching mechanism, and the second connecting portion has at least one inserting feature.

Preferably, the cable management device further includes a first connecting member. The first connecting member is connected to the first member, and the first mounting member is detachably connected to the first connecting member.

Preferably, the cable management device further includes a second member, a second connecting member, and a second mounting member. The second member is pivoted with respect to the second cable management arm, the second connecting member is connected to the second member, and the second mounting member is detachably connected to the second connecting member.

Preferably, the cable management device further includes a supporting member, a mounting base, and a third mounting member. The supporting member is configured to support one of the first cable management arm and the second cable management arm, the mounting base is arranged on the supporting member, and the third mounting member is detachable from the mounting base.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
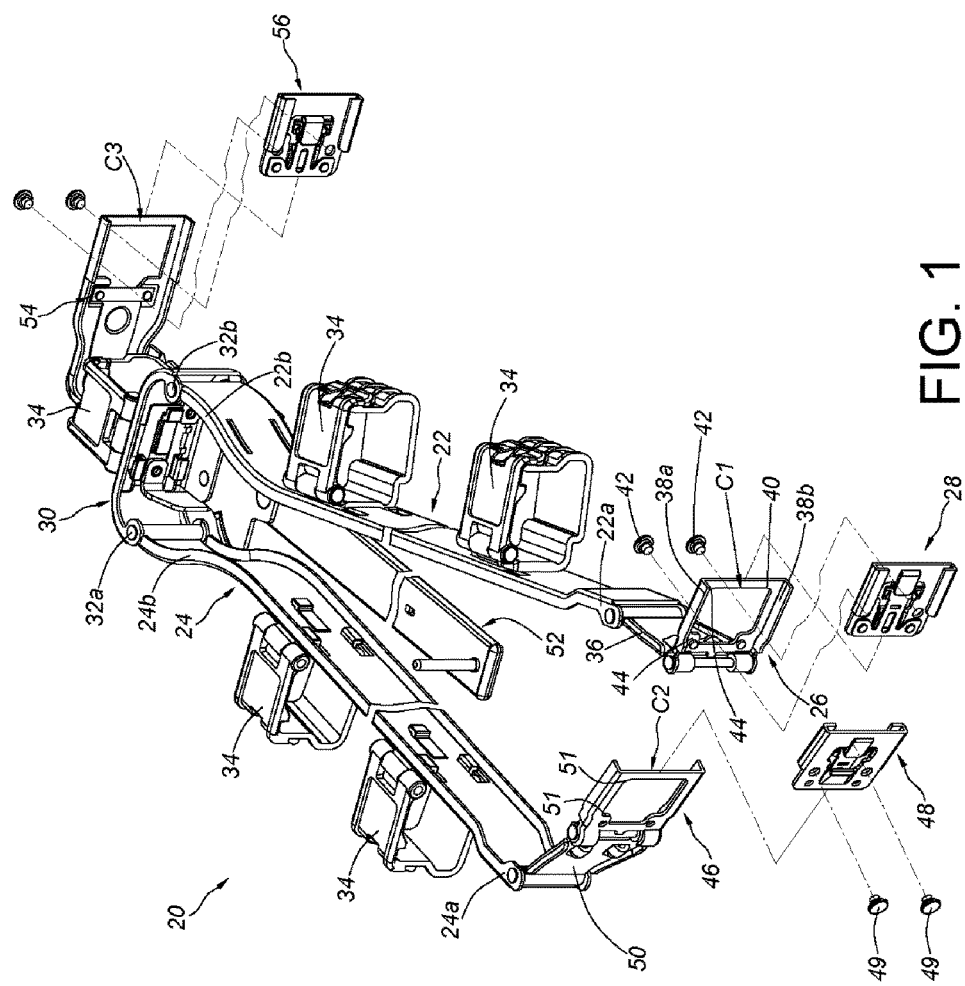
FIG. 1 is an exploded diagram illustrating a cable management device according to a first embodiment of the present invention.
Figure 2:
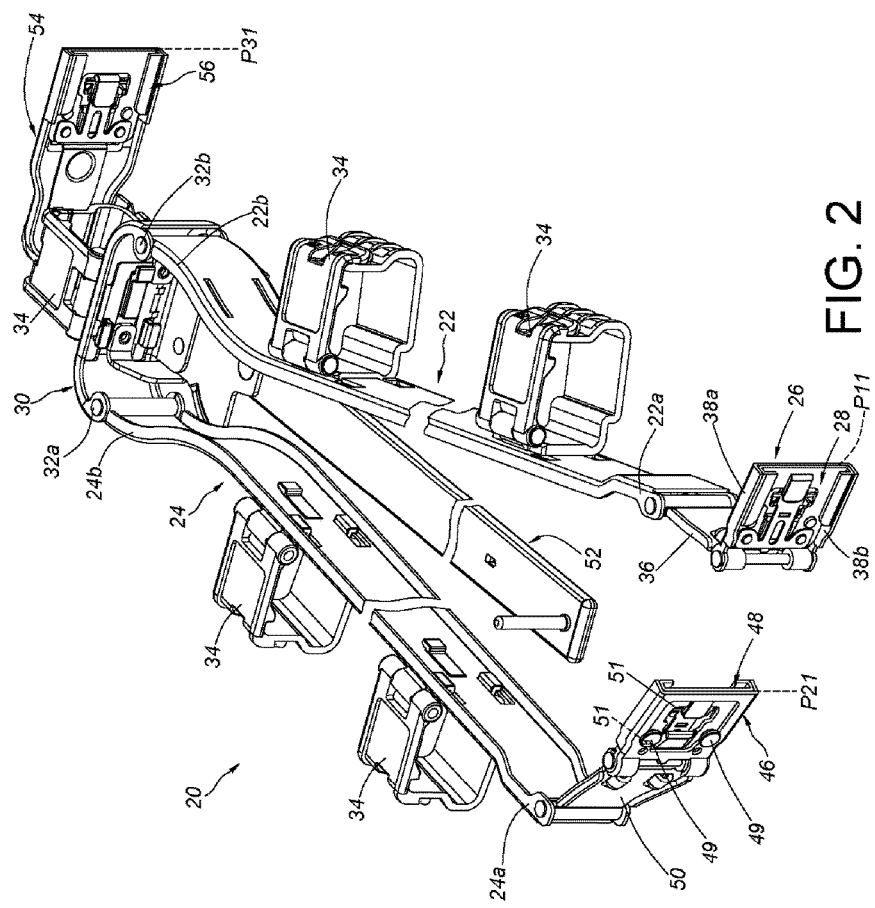
FIG. 2 is a schematic diagram illustrating the cable management device being in a first status according to the first embodiment of the present invention.

As shown in FIG. 1 and FIG. 2, the cable management device 20 according to the first embodiment of the present invention includes a first cable management arm 22, a second cable management arm 24, a first member 26, and a first connecting member 28.

The first cable management arm 22 includes a first end portion 22a and a second end portion 22b away from the first end portion 22a.

The second cable management arm 24 is moveable relative to the first cable management arm 22, and the second cable management arm 24 includes a first end portion 24a and a second end portion 24b away from the first end portion 24a. In practical application, the second cable management arm 24 is pivoted with respect to the first cable management arm 22. For example, the second cable management arm 24 is pivoted and adjacent to the second end portion 22b of the first cable management arm 22. Furthermore, the second end portion 24b of the second cable management arm 24 and the second end portion 22b of the first cable management arm 22 are pivoted with respect to each other. A pivoting base 30 being pivoted to the second end portion 24b of the second cable management arm 24 and the second end portion 22b of the first cable management arm 22 through two shafts 32a and 32b is illustrative of an example hereinafter. Preferably, one of the first cable management arm 22, the second cable management arm 24, and the pivoting base 30 has a cable holding feature 34. The first cable management arm 22, the second cable management arm 24, and the pivoting base 30 all having the cable holding feature 34 is illustrative of an example hereinafter.

The first member 26 is pivoted directly or indirectly with respect to the first cable management arm 22. The cable management device 20 further including a first extension member 36, being pivoted between the first cable management arm 22 and the first member 26, is illustrative of an example hereinafter, and the first member 26 is pivoted and adjacent to the first end portion 22a of the first cable management arm 22 through the first extension member 36.

The first connecting member 28 is connected to the first member 26 in an extendable and retractable manner. As an example, the first member 26 has a first wall 38a, a second wall 38b, and a side wall 40 connected between the first wall 38a and the second wall 38b. The first wall 38a, the second wall 38b, and the side wall 40 define a first channel C1, and the first channel C is configured to accommodate the first connecting member 28. Preferably, the first connecting member 28 has a first feature 42, and the first member 26 includes a corresponding feature 44. The first feature 42 cooperates with the corresponding feature 44 to allow the first connecting member 28 to be displaced within a limited range with respect to the first member 26. As an example, the first feature 42 is a protrusion, and the corresponding feature 44 comprises two stoppers. The protrusion is disposed from one side through to the other side of the side wall 40 of the first member 26, and the protrusion is constrained between the two stoppers.

Preferably, the cable management device 20 further includes a second member 46, a second connecting member 48, and a second extension member 50. The second member 46 is pivoted directly or indirectly with respect to the second cable management arm 24. The second extension member 50 being pivoted between the second cable management arm 24 and the second member 46 is illustrative of an example hereinafter, and the second member 46 is pivoted and adjacent to the first end portion 24a of the second cable management arm 24 through the second extension member 50. Furthermore, the second connecting member 48 is connected to the second member 46 in an extendable and retractable manner. As an example, the second connecting member 48 is accommodated in a second channel C2 defined by the second member 46, and the second connecting member 48 can be displaced within a limited range with respect to the second member 46. For example, the second connecting member 48 has another first feature 49 (such as a protrusion), and the first feature 49 is able to constrain the movement of the second connecting member 48 by cooperating with another corresponding feature 51 (such as two stoppers) on the second member 46. Herein, the structural configuration of the second connecting member 48 and the second member 46 is substantially identical to that of the first connecting member 28 and the first member 26, and related descriptions are omitted herein for simplicity.

Preferably, the cable management device 20 further includes a supporting member 52, a mounting base 54, and a third connecting member 56. The supporting member 52 has a predetermined length, and the supporting member 52 is moveably arranged at a bottom of the first cable management arm 22 and the second cable management arm 24, and the supporting member 52 is configured to support one of the first cable management arm 22 and the second cable management arm 24. The supporting member 52 being connected to the bottom of the pivoting base 30 is illustrative of an example hereinafter. On the other hand, the mounting base 54 is arranged on the supporting member 52. For example, the mounting base 54 is moveably connected (e.g., can be pivoted to) and adjacent to the end portion of the supporting member 52. Since all of the mounting base 54, the first member 26, and the second member 46 are able to pivot, all of the three items can be oriented toward the same direction. The third connecting member 56 can be connected to the mounting base 54 in an extendable and retractable manner. That is, the third connecting member 56 is accommodated in a third channel C3 defined by the mounting base 54, and the third connecting member 56 can be displaced within a limited range with respect to the mounting base 54. Herein, the structural configuration of the third connecting member 56 and the mounting base 54 is substantially identical to that of the first connecting member 28 and the first member 26 (or substantially identical to that of the second connecting member 48 and the second member 46), and related descriptions are omitted herein for simplicity.

As shown in FIG. 2, the first connecting member 28 can be located at a first position P11 relative to the first member 26, the second connecting member 48 can be located at a first position P21 relative to the second member 46, and the third connecting member 56 can be located at a first position P31 relative to the mounting base 54.

Figure 3:
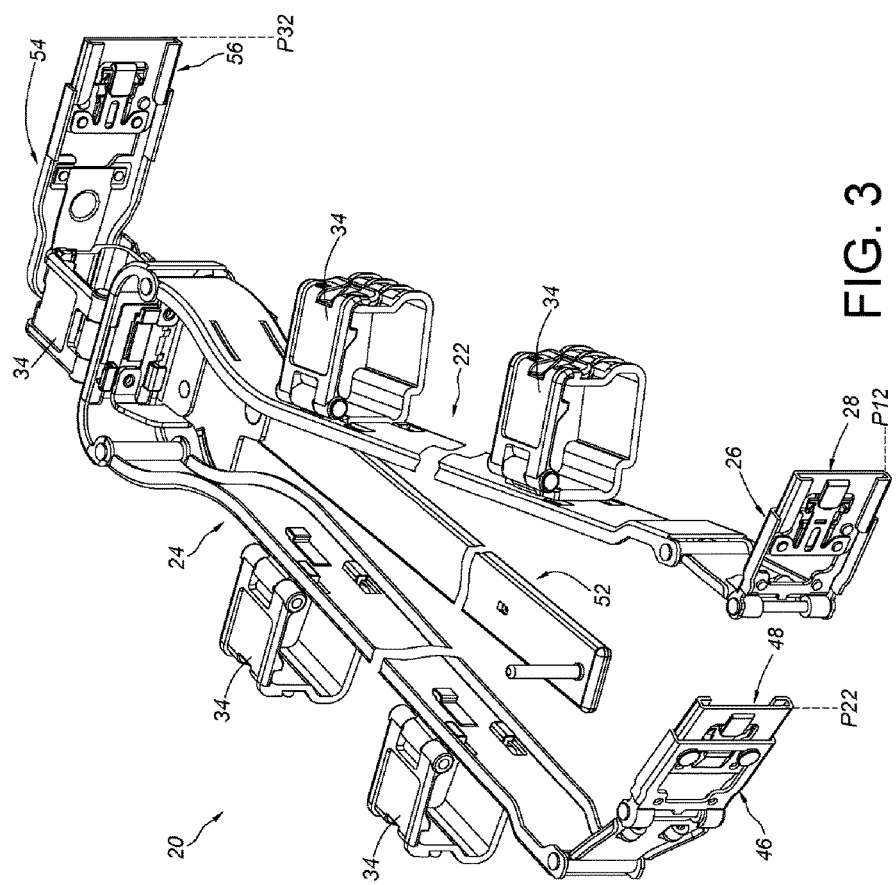
FIG. 3 is a schematic diagram illustrating the cable management device being in a second status according to the first embodiment of the present invention.

As shown in FIG. 3, the first connecting member 28 is able to be displaced to a second position P12 from the aforementioned first position P11 relative to the first member 26, the second connecting member 48 is able to be displaced to a second position P22 from the aforementioned first position P21 relative to the second member 46, and the third connecting member 56 is able to be displaced to a second position P32 from the aforementioned first position P31 relative to the mounting base 54.

Figure 4:
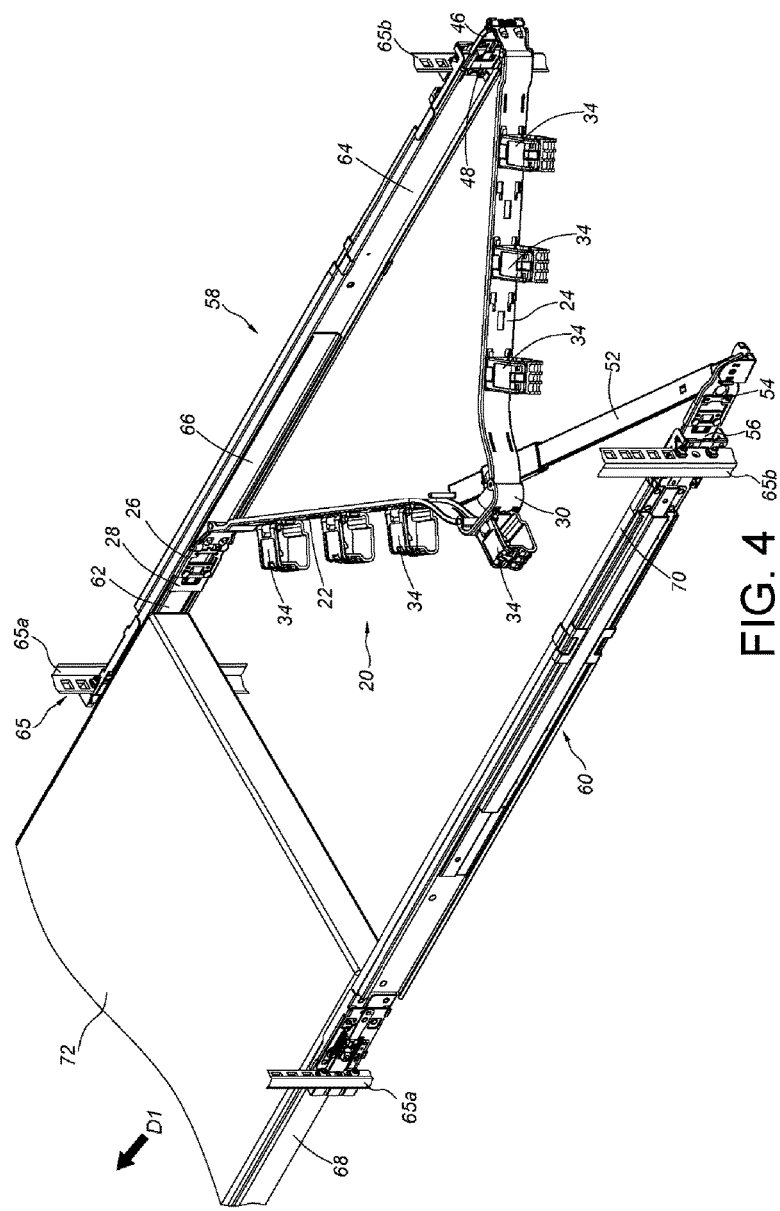
FIG. 4 is a diagram illustrating the electronic device being pulled out of a rack by using a slide rail of a slide rail assembly according to the first embodiment of the present invention.

As shown in FIG. 4, a rack system includes the cable management device 20, a first slide rail assembly 58 (i.e., a slide rail assembly), and a second slide rail assembly 60 (i.e., another slide rail assembly). Herein, the cable management device 20 and the slide rail assembly 58 compose a coupling assembly.

The first slide rail assembly 58 includes a first rail 62 and a second rail 64. The second rail 64 is fixed to a first rack post 65a and a second rack post 65b of a rack 65, and the first rail 62 is displaceable relative to the second rail 64. Preferably, the first slide rail assembly 58 further includes a middle rail 66 moveably mounted between the first rail 62 and the second 64 and configured to increase movement of the first rail 62 relative to the second rail 64. Similarly, the second slide rail assembly 60 includes a third rail 68 and a fourth rail 70. The fourth rail 70 is fixed to another first rack post 65a and another second rack post 65b of the rack 65, and the third rail 68 is displaceable relative to the fourth rail 70.

The first cable management arm 22 of the cable management device 20 is connected to the first rail 62 (as an example, connected to a rear end of the first rail 62) of the first slide rail assembly 58 through the first connecting member 28. The second cable management arm 24 is connected to the second rail 64 of the first slide rail assembly 58. Herein, the second cable management arm 24 is connected to the second rail 64 (as an example, connected to a rear end of the second rail 64) of the first slide rail assembly 58 through the second connecting member 48. Furthermore, the third connecting member 56 on the supporting member 52 is configured to be connected to the fourth rail 70 (as an example, connected to a rear end of the fourth rail 70) of the second slide rail assembly 60.

Herein, an electronic device 72 is mounted between the first slide rail assembly 58 and the second slide rail assembly 60, and the electronic device 72 can be pulled from inside to outside the rack 65 toward a first direction D1 through the first rail 62 and the third rail 68. Corresponding to the first rail 62 of the first slide rail assembly 58 (or the electronic device 72), the first cable management arm 22 displaces outside the rack 65 toward the first direction D1, so as to expand relative to the second cable management arm 24. The cable holding feature 34 is configured to accommodate the cables behind the electronic device 72, and the cable management feature 34 mentioned herein is obvious to those of ordinary skill in the art, and related descriptions are omitted herein for simplicity. Furthermore, the supporting member 52 is configured to support the first cable management arm 22 or the second cable management arm 24.

Figure 5:
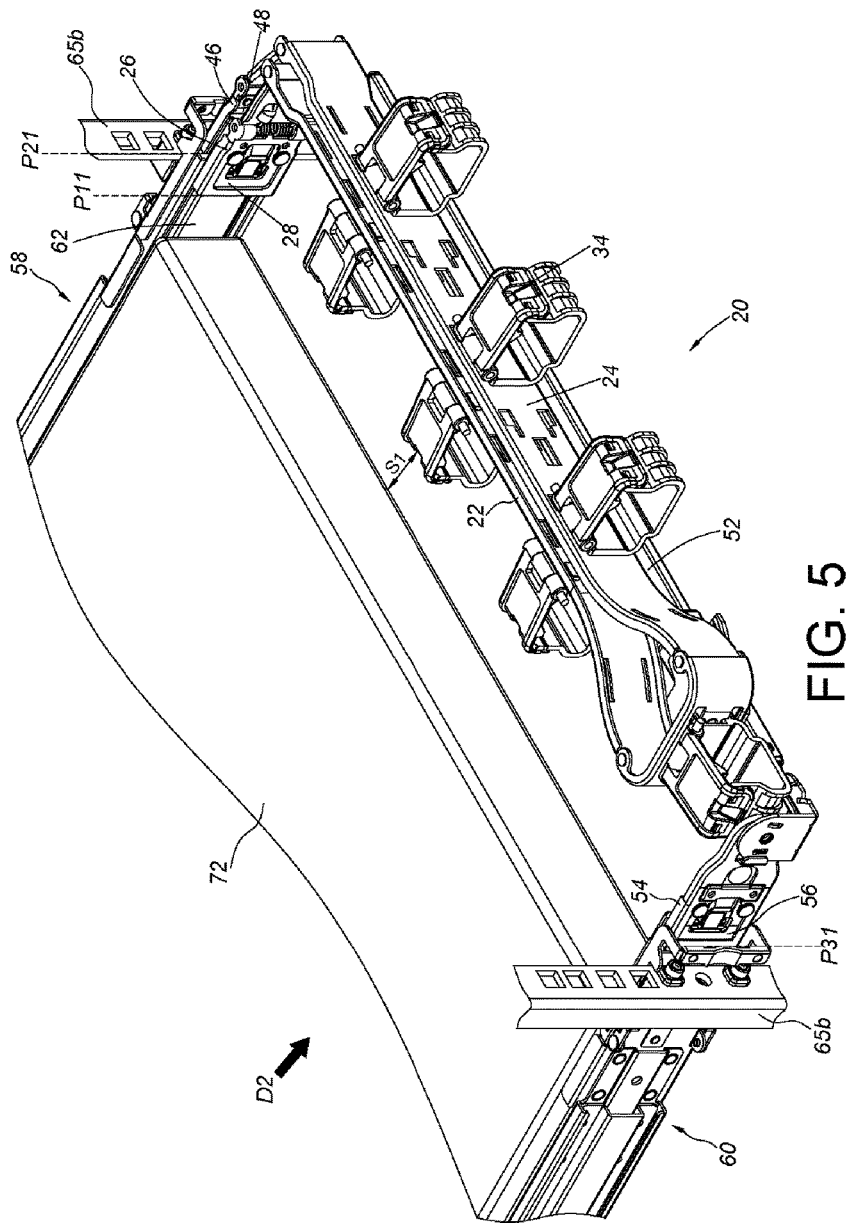
FIG. 5 is a diagram illustrating the electronic device being pushed into the rack by using the slide rail of the slide rail assembly and the cable management device being in the first status according to the first embodiment of the present invention.

As shown in FIG. 5, the electronic device 72 is able to be pushed from outside to inside the aforementioned rack 65 along a second direction D2. Herein, the first cable management arm 22 is retracted relative to the second cable management arm 24 in response to a displacement of the first rail 62 of the first slide rail assembly (or the electronic device 72) along the second direction D2. Furthermore, the supporting member 52 is configured to support the first cable management arm 22 or the second cable management arm 24.

In addition, the first cable management arm 22 is in a retracted state relative to the second cable management arm 24. When the first connecting member 28 is located at the first position P11 relative to the first member 26, the second connecting member 48 is located at the first position P21 relative to the second member 46, and/or the third connecting member 56 is located at the first position P31 relative to the mounting base 54, a first spacing S1 is defined between a rear side of the electronic device 72 and (the first cable management arm 22 of) the cable management device 20. It should be noticed that the first spacing S1 is occasionally too narrow for the cables behind the electronic device 72 to be stored in the first spacing S1, or the first spacing S1 is occasionally too narrow for operators to execute cable arrangement behind the electronic device 72.

Figure 6:
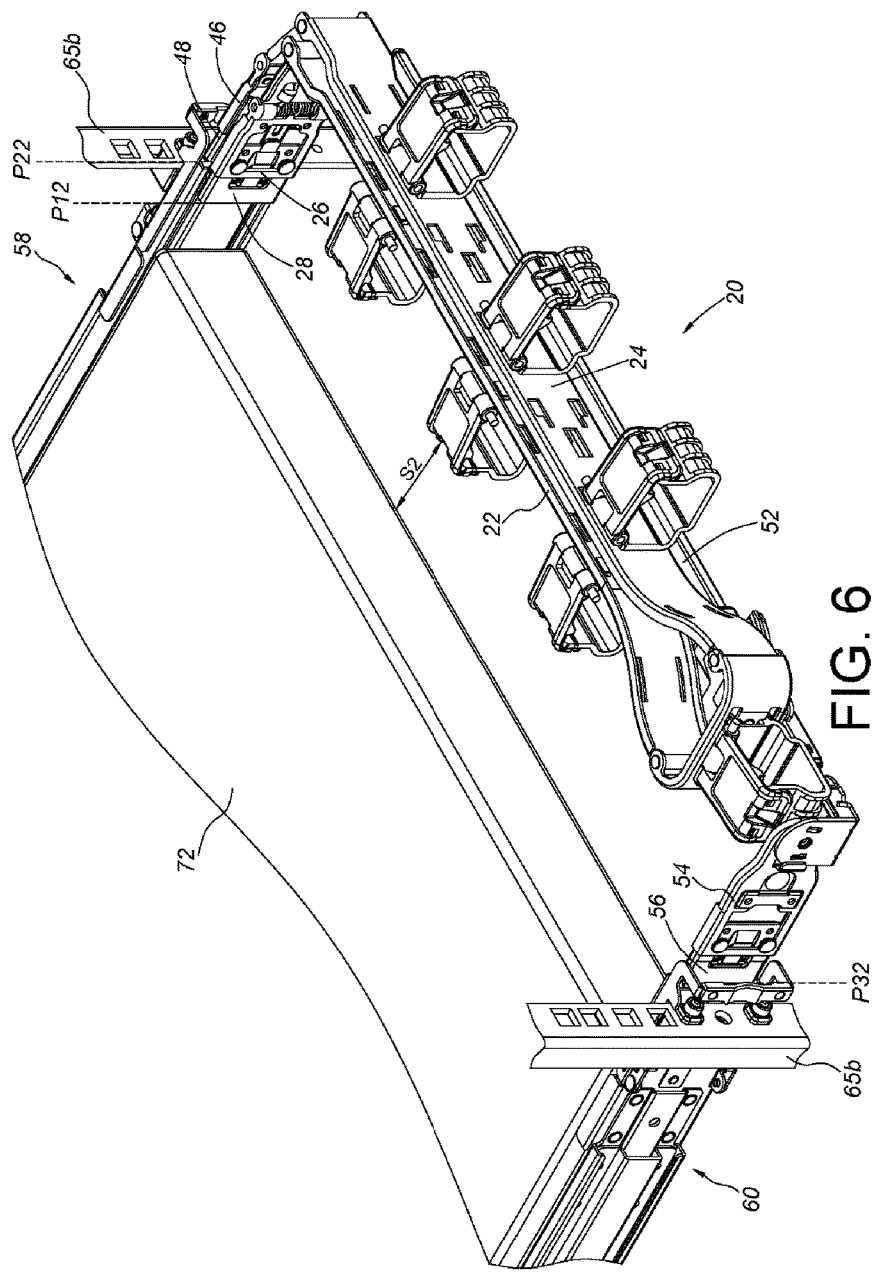
FIG. 6 is a diagram illustrating the electronic device being pushed into the rack by using the slide rail of the slide rail assembly and the cable management device being in the second status according to the first embodiment of the present invention.

As shown in FIG. 6, the first cable management arm 22 is in the retracted state relative to the second cable management arm 24. With the first connecting member 28 being located at the second position P12 relative to the first member 26, the second connecting member 48 being located at the second position P22 relative to the second member 46, and/or the third connecting member 56 being located at the second position P32 relative to the mounting base 54 is able to increase the connection length of the cable management device 20. In other words, the connection length between the cable management device 20 and the slide rail assemblies 58 and 60 can be increased. Accordingly, a second spacing S2 is defined between the rear side of the electronic device 72 and (the first cable management arm 22 of) the cable management device 20, with the second spacing S2 being greater than the aforementioned first spacing S1. Therefore, the second spacing S2 facilitates the operators to utilizes space behind the electronic device 72, e.g., it facilitates the operators to execute the cable arrangement.

Figure 7:
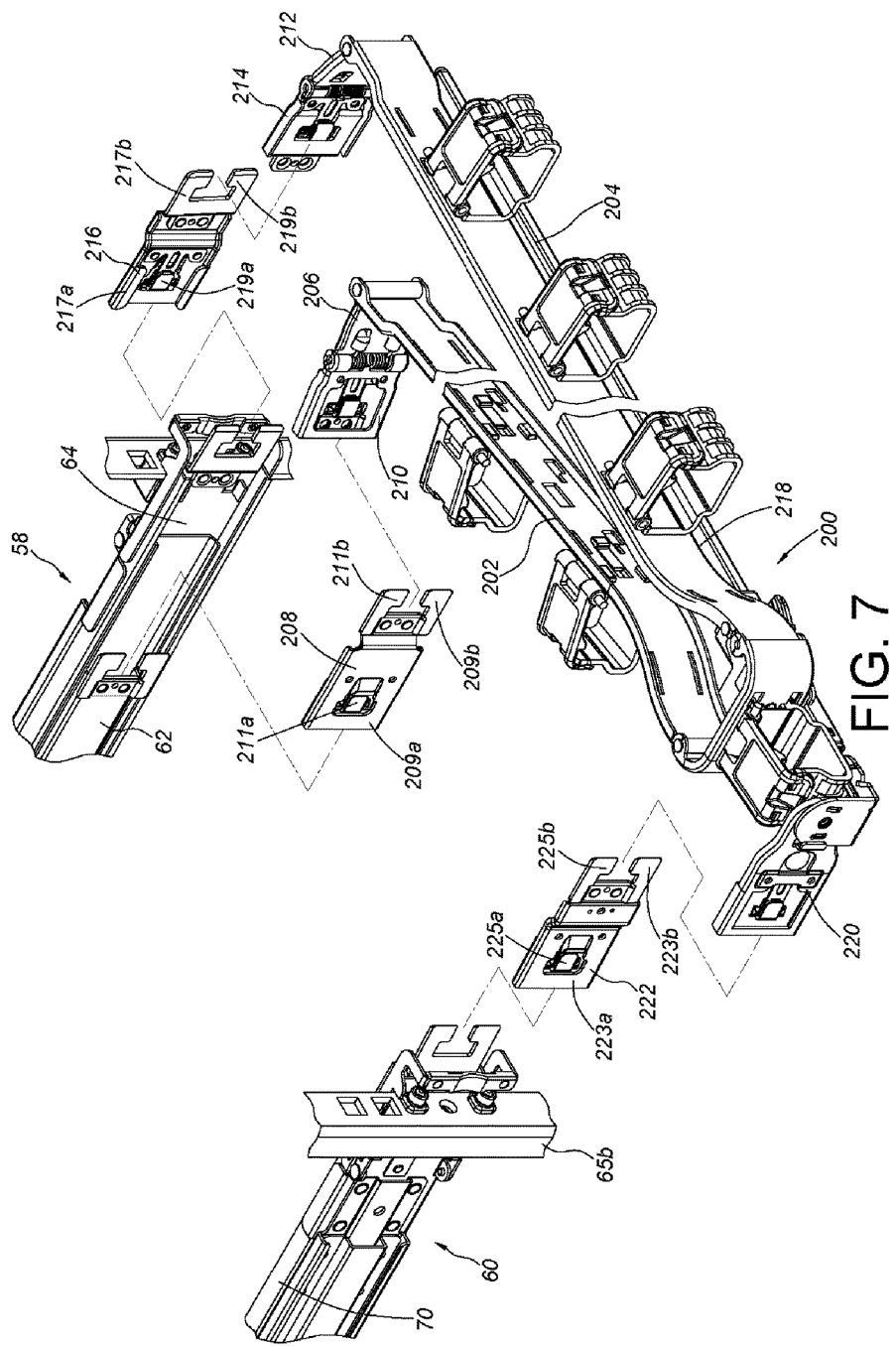
FIG. 7 is an exploded diagram illustrating the cable management device and the slide rail assembly according to a second embodiment of the present invention.
Figure 8:
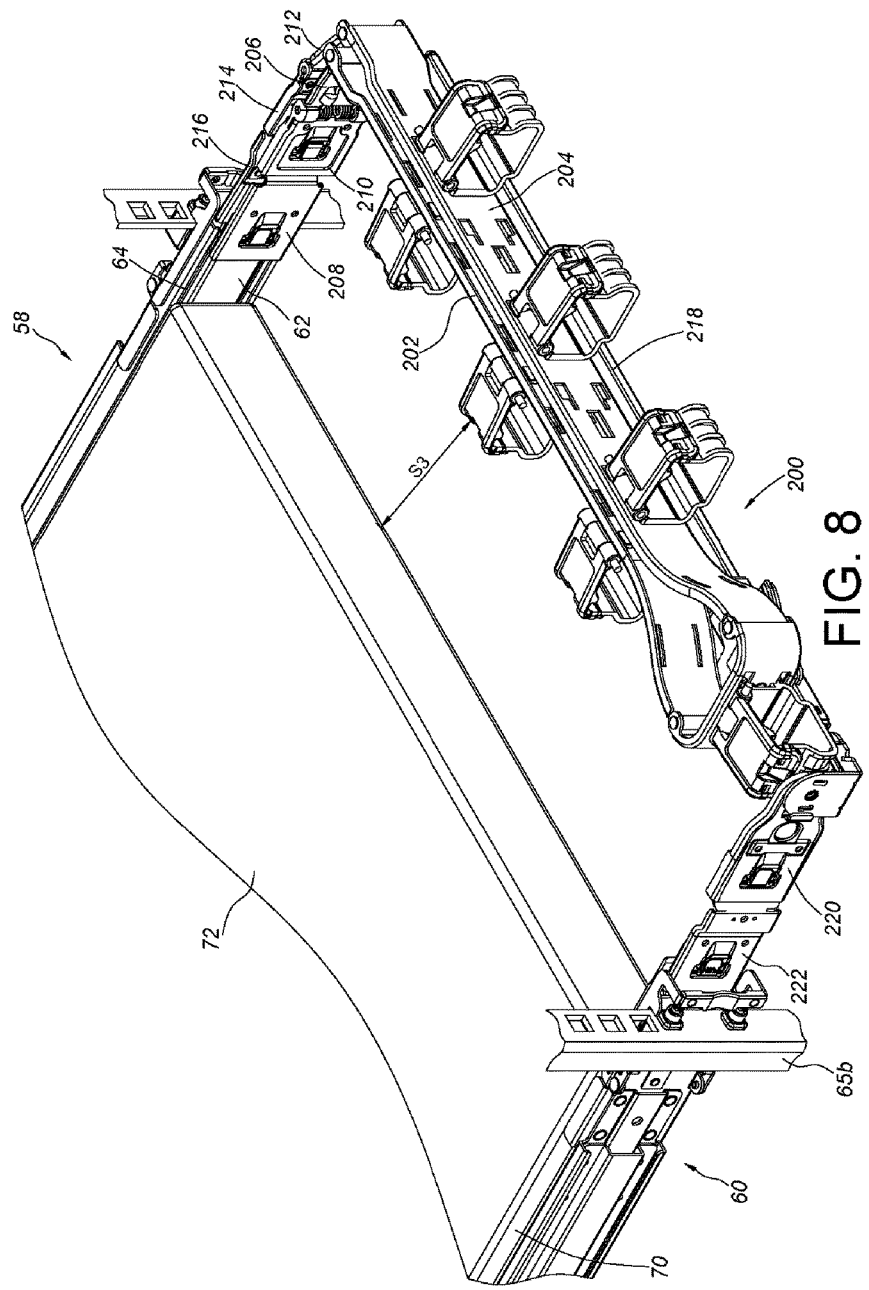
FIG. 8 is a diagram illustrating the cable management device and the slide rail assembly being assembled with an electronic device on the rack according to the second embodiment of the present invention.

As shown in FIG. 7 and FIG. 8, the cable management device 200 according to the second embodiment of the present invention can be implemented in the first slide rail assembly 58 and the second slide rail assembly 60. Different from the cable management device 20 of the first embodiment, using the first connecting member 28, the second connecting member 48 or the third connecting member 56 for displacement in the extension or retraction manner to adjust spacing, the cable management device 200 of the second embodiment improves spacing issue by using detachable mounting members.

In practical application, the cable management device 200 includes a first cable management arm 202, a second cable management arm 204, a first member 206, and a first mounting member 208.

The second cable management arm 204 is movable relative to the first cable management arm 202. Herein, the second cable management arm 204 is pivoted with respect to the first cable management arm 202, e.g., the ends of the second cable management arm 204 and the first cable management arm 202 are pivot with respect to each other, and the second cable management arm 204 is connected to the second rail 64 of the first slide rail assembly 58.

The first member 206 is directly or indirectly pivoted with respect to the first cable management arm 202. The first mounting member 208 is detachable relative to the first member 206. In the present embodiment, the cable management device 200 further includes a first connecting member 210 connected to the first member 206, and the first mounting member 208 is detachably connected to the first connecting member 210. In an alternative embodiment where the first connecting member 210 is omitted, the first mounting member 208 can also be directly and detachably connected to the first member 206, and the present invention is not limited thereto. Furthermore, the first mounting member 208 is detachably connected between the first member 206 and (the rear end of) the first rail 62. The first mounting member 208 has a first predetermined length, and the first mounting member 208 is used to increase a connection length defined between the first member 206 and the first rail 62. Herein, the configuration of the first mounting member 208 is oriented substantially along a longitudinal direction of the first rail 62 of the first slide rail assembly 58. Furthermore, a first connecting portion 209a and a second connecting portion 209b are disposed on two opposite ends of the first mounting member 208, wherein the first connecting portion 209a has a latching mechanism 211a, and the second connection portion 209b has at least one inserting feature 211b. According to such arrangement, corresponding features can be disposed on the slide rail and the cable management device to engage with the first mounting member 208. As an example, the latching mechanism 211a of the first connecting portion 209a can be detachably connected to the inserting feature 211b of the second connecting portion 209b. Accordingly, the aforementioned slide rail and the cable management device allow the first mounting member 208 to be detachably connected between the first member 206 and the first rail 62 in a latching or inserting manner, but the present invention is not limited thereto.

Preferably, the cable management device 200 further includes a second member 212, a second connecting member 214 and a second mounting member 216. The second member 212 is directly or indirectly pivoted with respect to the second cable management arm 204. The second mounting member 216 is detachable relative to the second member 212. In the present embodiment, the second connecting member 214 is connected to the second member 212, and the second mounting member 216 is detachably connected to the second connecting member 214. In an alternative embodiment where the second connecting member 214 is omitted, the second mounting member 216 can also be directly and detachably connected to the second member 212, and the present invention is not limited thereto. Furthermore, the second mounting member 216 has a similar configuration as the aforementioned first mounting member 208 does, wherein the second mounting member 216 has a first connecting portion 217a, a second connecting portion 217b, a latching mechanism 219a, and an inserting feature 219b. Accordingly, the second mounting member 216 can be detachably connected between the second connecting member 214 and (the rear end of) the second rail 64. The second mounting member 216 has a second predetermined length, and the second mounting member 216 is used to increase a connection length defined between the second member 212 and the second rail 64. Herein, the configuration of the second mounting member 216 is substantially oriented along a longitudinal direction of the second rail 64 of the first slide rail assembly 58. Furthermore, the second mounting member 216 can be detachably connected between the second member 212 and the second rail 64 in a latching or inserting manner, but the present invention is not limited thereto.

Preferably, the cable management device 200 further includes a supporting member 218, and the supporting member 218 is used to support one of the first cable management arm 202 and the second cable management arm 204.

Preferably, the cable management device 200 further includes a mounting base 220 and a third mounting member 222. The mounting base 220 is arranged on the supporting member 218, and the third mounting member 222 is detachable relative to the mounting base 220. Furthermore, the third mounting member 222 is configured similar to the aforementioned first mounting member 208 and second mounting member 216 do, wherein the third mounting member 222 has a first connecting portion 223a, a second connecting portion 223b, a latching mechanism 225a, and an inserting feature 225b. Accordingly, the third mounting member 222 can be detachably connected between the mounting base 220 and (the rear end of) the fourth rail 70 of the second slide rail assembly 60. The third mounting member 222 has a third predetermined length, and the third mounting member 222 is used to increase a connection length defined between the mounting member 220 and the fourth rail 70. Herein, the configuration of the third mounting member 222 is substantially oriented along a longitudinal direction of the fourth rail 70 of the second slide rail assembly 60. Furthermore, the third mounting member 222 can be detachably connected between the mounting base 220 and the fourth rail 70 in a latching or inserting manner, but the present invention is not limited thereto.

When spacing (such as the aforementioned first spacing S1) between the electronic device 72 and the cable management device 200 being adjusted to a larger third spacing S3 is desired, it is able to adjust the spacing between the cable management device 72 and the electronic device 72 by the first mounting member 208 with the first predetermined length being detachably connected between the first member 206 and the first rail 62, and/or the second mounting member 216 with the second predetermined length being detachably connected between the second member 212 and the second rail 64, and/or the third mounting member 222 with the third predetermined length being detachably connected between the mounting base 220 and the fourth rail 70. The third spacing S3 facilitates the implementation of cables in the area behind the electronic device 72.

It can be seen from the aforementioned embodiments according to the present invention that the coupling assembly and the cable management device herein include the following advantages: the cable management devices 20 and 200 can modify the connection length to resolve the issue of limited usable space using an extendable and retractable mechanism (e.g., the connecting members 28, 30, and/or 56 are extendable and retractable) and a detachable connection (e.g., the mounting bases 208, 216 and/or 222 are detachable, and the mounting bases can be installed by operators according to need).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A coupling assembly, comprising:
   a slide rail assembly comprising a first rail and a second rail, the first rail being displaceable relative to the second rail; and
   a cable management device, comprising:
      a first cable management arm;
      a second cable management arm pivoted with respect to the first cable management arm;
      a first member pivoted with respect to the first cable management arm; and
      a first connecting member connected to the first member in an extendable and retractable manner;
   wherein the second cable management arm is connected to the second rail;
   wherein the first cable management arm is connected to the first rail through the first connecting member;
   a first extension member;
   wherein the first extension member is pivoted between the first cable management arm and the first member; and
   wherein the cable management device further comprises a second member, a second connecting member, and a second extension member;
   wherein the second member is pivoted with respect to the second cable management arm; and
   the second connecting member is connected to the second member in an extendable and retractable manner; and
   the second cable management arm is connected to the second rail through the second connecting member.

2. The coupling assembly of claim 1, wherein the second extension member pivots between the second cable management arm and the second member.

3. The coupling assembly of claim 1, wherein the cable management device further comprises a supporting member, a mounting base and a third connecting member the supporting member is configured to support one of the first cable management arm and the second cable management arm, the mounting base is arranged on the supporting member, and the third connecting member is connected to the mounting base in an extendable and retractable manner.

4. The coupling assembly of claim 3, further comprising another sliding rail assembly, wherein said another sliding rail assembly comprises a third rail and a fourth rail, the third rail is displaceable relative to the fourth rail, and the third connecting member is connected to the fourth rail.

* * * * *